United States Patent
Lacy et al.

(10) Patent No.: US 9,303,517 B2
(45) Date of Patent: Apr. 5, 2016

(54) CHANNEL MARKER AND RELATED METHODS

(75) Inventors: Benjamin Paul Lacy, Greer, SC (US); Srikanth Chandrudu Kottilingam, Simpsonville, SC (US); David Edward Schick, Greenville, SC (US); Brian Lee Tollison, Honea Path, SC (US)

(73) Assignee: General Electric Company, Schenectady, NY (US)

(*) Notice: Subject to any disclaimer, the term of this patent is extended or adjusted under 35 U.S.C. 154(b) by 939 days.

(21) Appl. No.: 13/524,055

(22) Filed: Jun. 15, 2012

(65) Prior Publication Data
US 2013/0336800 A1     Dec. 19, 2013

(51) Int. Cl.
*F01D 5/18* (2006.01)
*C23C 14/04* (2006.01)
*F01D 5/28* (2006.01)

(52) U.S. Cl.
CPC . *F01D 5/186* (2013.01); *C23C 4/01* (2016.01); *C23C 14/042* (2013.01); *F01D 5/288* (2013.01); *F05D 2230/30* (2013.01); *F05D 2230/90* (2013.01); *F05D 2260/204* (2013.01)

(58) Field of Classification Search
CPC .............. B05D 1/02; B05D 1/32; B05D 3/06; B05D 3/068; C25D 5/022; C23C 4/005; B23P 2700/06; F01D 5/186; F01D 5/187; F01D 5/288; F05D 2230/30; F05D 2230/90; F05D 2260/204; F05D 2300/611
See application file for complete search history.

(56) References Cited

U.S. PATENT DOCUMENTS

| | | | | |
|---|---|---|---|---|
| 2,641,439 | A | * | 6/1953 | Williams .................... 416/90 R |
| 2,993,264 | A | * | 7/1961 | Grenoble ..................... 428/635 |
| 4,743,462 | A | * | 5/1988 | Radzavich et al. ............ 427/448 |
| 5,640,767 | A | * | 6/1997 | Jackson et al. ........... 29/889.721 |
| 5,875,549 | A | * | 3/1999 | McKinley .................... 29/889.2 |
| 5,902,647 | A | | 5/1999 | Venkataramani et al. |
| 6,214,248 | B1 | * | 4/2001 | Browning et al. ............... 216/56 |
| 6,321,449 | B2 | * | 11/2001 | Zhao et al. ................ 29/890.01 |
| 6,335,078 | B2 | * | 1/2002 | Venkataramani et al. .... 428/139 |
| 6,383,602 | B1 | * | 5/2002 | Fric ........................ F01D 5/186 |
| | | | | 415/115 |
| 6,461,108 | B1 | | 10/2002 | Lee et al. |
| 6,528,118 | B2 | | 3/2003 | Lee et al. |
| 6,617,003 | B1 | | 9/2003 | Lee et al. |

(Continued)

FOREIGN PATENT DOCUMENTS

| EP | 1076106 A1 | 2/2001 |
|---|---|---|
| EP | 2423346 A1 | 2/2012 |

OTHER PUBLICATIONS

Institute of Materials, Minerals, and Mining, Is Graphite a Ceramic?, Date Unknown.*

(Continued)

*Primary Examiner* — Richard Edgar
*Assistant Examiner* — Eldon Brockman
(74) *Attorney, Agent, or Firm* — Ernest G. Cusick; Hoffman Warnick LLC (57) ABSTRACT

Various embodiments of the disclosure include a component, methods of forming components, and methods of cooling components. In some embodiments, a component is disclosed including: a body; a microchannel extending through a portion of the body; a thermal barrier coating (TBC) covering a portion of the microchannel; and a marker member extending from the microchannel through the TBC or from an end of the microchannel, the marker member indicating a location of the microchannel in the body.

6 Claims, 8 Drawing Sheets

(56) References Cited

U.S. PATENT DOCUMENTS

| | | | |
|---|---|---|---|
| 7,487,641 B2 | 2/2009 | Frechette et al. | |
| 7,625,180 B1 * | 12/2009 | Liang | F01D 5/186 29/889.2 |
| 7,900,458 B2 | 3/2011 | James et al. | |
| 8,533,949 B2 * | 9/2013 | Bunker | F01D 5/147 29/889.7 |
| 8,722,144 B2 * | 5/2014 | Ohara | C23C 4/005 29/889.1 |
| 2002/0106457 A1 | 8/2002 | Lee et al. | |
| 2004/0048003 A1 * | 3/2004 | Jeutter et al. | 427/555 |
| 2012/0114912 A1 * | 5/2012 | Bunker | C23C 4/02 428/173 |
| 2012/0207953 A1 * | 8/2012 | Bunker | F01D 5/147 428/34.1 |
| 2012/0243995 A1 * | 9/2012 | Bunker | F01D 5/18 416/95 |

OTHER PUBLICATIONS

Search Report and Written Opinion from EP Application No. 13171380.2 dated Oct. 2, 2013.

U.S. Appl. No. 13/042,167, filed Mar. 7, 2011.

U.S. Appl. No. 12/943,646, filed Nov. 10, 2012.

* cited by examiner

CHANNEL MARKER AND RELATED METHODS

FIELD OF THE INVENTION

The subject matter disclosed herein relates to cooling components. More particularly, aspects of the invention include apparatuses and methods for cooling components.

BACKGROUND OF THE INVENTION

During formation of components, such as components used in a turbine, dynamoelectric machine, or any other machine operating at high temperatures, channels are often fabricated within the components to allow for cooling of those components. These channels can serve as conduits for a cooling fluid, such as a cooling gas or liquid, during use of the component. However, subsequent conventional fabrication processes can obstruct these channels, making it difficult to properly cool the component during use.

BRIEF DESCRIPTION OF THE INVENTION

Various embodiments of the invention include a component, methods of forming components, and methods of cooling components. In some embodiments, a component is disclosed including: a body; a microchannel extending through a portion of the body; a thermal barrier coating (TBC) covering a portion of the microchannel; and a marker member extending from the microchannel through the TBC or from an end of the microchannel, the marker member indicating a location of the microchannel in the body.

A first aspect of the invention includes a component having: a body; a microchannel extending through a portion of the body; a thermal barrier coating (TBC) covering a portion of the microchannel; and a marker member extending from the microchannel through the TBC or proximate an end of the microchannel, the marker member indicating a location of the microchannel in the body.

A second aspect of the invention includes a method including: forming a microchannel in a component; providing a marker in the microchannel; and forming a thermal barrier coating (TBC) over the microchannel and a portion of the marker to substantially seal the microchannel, wherein a portion of the marker extends beyond an outer surface of the TBC after the forming of the TBC.

A third aspect of the invention includes a method including: providing a component having: one of a microchannel or a film hole extending at least partially therethrough; a thermal barrier coating (TBC) covering a portion of the one of the microchannel or the film hole; and a marker extending from the channel through the TBC or proximate an end of the one of the microchannel or the film hole; and machining the marker to expose the one of the microchannel or the film hole through the TBC.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As noted herein, the subject matter disclosed relates to cooling components. More particularly, aspects of the invention include a component having a marker identifying a cooling conduit extending therethrough, where the marker extends through a coating on the component.

Conventionally, when forming one or more channels (e.g., microchannels or film holes) in a component, e.g., for cooling that component, these channels are subsequently sealed or covered using a thermal barrier coating (TBC). However, after forming the TBC, it can be difficult to locate and access the microchannel(s) or film hole(s) which are buried under this coating. Accessing the microchannel (or film hole) can be helpful to provide an exit path for coolant flowing through the channel.

Various embodiments of the invention help to remedy the above-noted shortcomings in the conventional microchannel/film hole formation process by forming a marker or other indicator for the microchannel (or film hole) which is accessible through the subsequently formed TBC.

Various embodiments of the invention include a component having: a body; a microchannel extending through a portion of the body; a thermal barrier coating (TBC) covering a portion (e.g., an upper portions) of the microchannel; and a marker member extending from the microchannel through the TBC or proximate (e.g., touching or nearly touching) an end of the microchannel, the marker member indicating a location of the microchannel in the body. This marker can then be used to determine a location for drilling an exit hole. The marker itself can be drilled by a variety of methods to assist in creating this exit hole.

Various embodiments include a method of forming a component, the method including: forming a microchannel in a component; inserting a marker in the microchannel; and forming a thermal barrier coating (TBC) over the microchannel and a portion of the marker to substantially seal the microchannel, wherein a portion of the marker extends beyond an outer surface of the TBC after the forming of the TBC.

Various other embodiments include a method of cooling a component, the method including: providing a component having: a microchannel extending at least partially therethrough; a thermal barrier coating (TBC) covering a portion of the microchannel; and a marker extending from the channel through the TBC or proximate (e.g., touching or nearly touching) an end of the microchannel; and machining the marker to expose the microchannel through the TBC. This method can include providing a cooling fluid to an inlet of the microchannel for cooling the component. This inlet can be formed from the machined microchannel.

Figure 1:
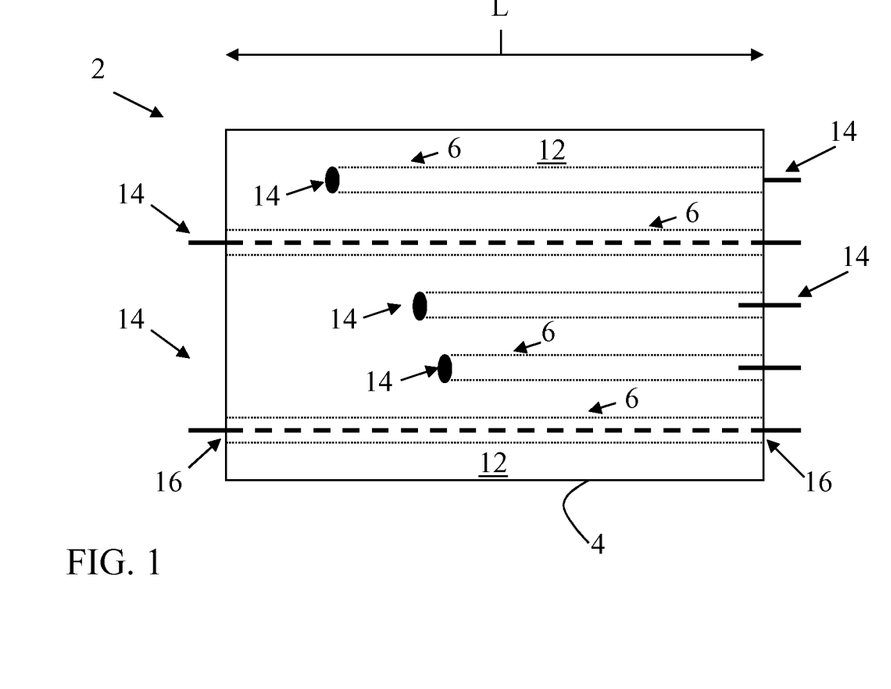
FIG. 1 shows a top view of a component according to various embodiments of the invention.
Figure 2:
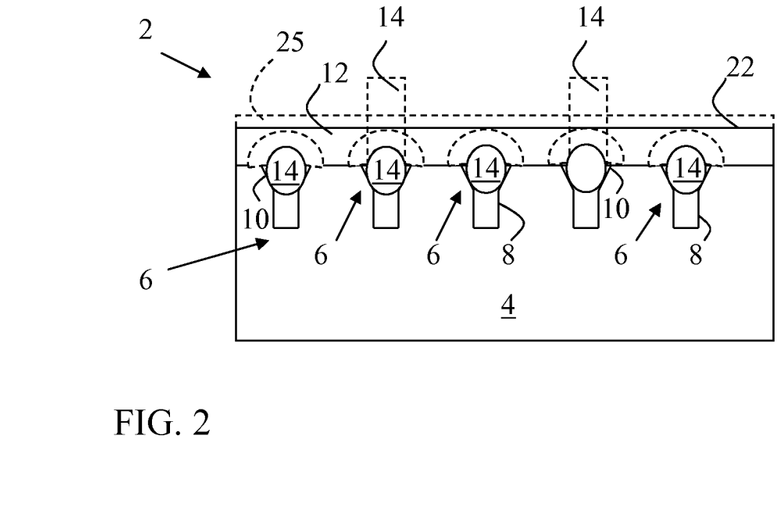
FIG. 2 shows an end view of a component according to various embodiments of the invention.

Turning to FIGS. 1 and 2, a plan view and end view, respectively, of a portion of a component 2 are shown according to various embodiments of the invention. As described herein, in some cases, the component 2 includes a turbine component, such as a gas turbine component (or steam turbine component). In some particular cases, the component 2 includes a turbine vane or nozzle, a turbine shroud, platform, endwall, etc., which may be subject to high-temperature conditions during operation of the turbine.

In any case, the component 2 can include a body 4, which can be formed, for example of a metal such as steel or another suitable alloy. Also shown, the component 2 can include a microchannel 6 extending through a portion of the body 4. In some cases, the microchannel 6 can range in size from approximately 0.01 inches to approximately 0.1 inches wide, with similar depth dimensions (0.01-0.1 inches). In various cases, the microchannel 6 has a substantially rectangular cross-section, but in other cases, the microchannel 6 has a substantially circular, round, or oval-shaped cross-section. In some cases, the microchannel 6 can have a substantially constant cross-section throughout its length (L), but in other cases, it can have an inconsistent cross-section. In various embodiments, the microchannel(s) 6 can include heat-transfer-enhancing features such as turbulators.

The microchannel 6 is shown in greater detail in the end view of FIG. 2. In particular, the microchannel 6 can include a trough 8 and a shoulder 10 at an edge of the trough 8. The microchannel 6 can be formed using any conventional metal machining techniques, e.g., laser formation or the like. A thermal barrier coating (TBC) 12 is also shown covering a portion (e.g., an upper-facing surface portion) of the microchannel 6. In various embodiments, the microchannel 6 can be covered prior to applying the TBC 12. In some cases, the microchannel 6 can be covered by at least one of the following processes: bridging a bond coat over the channel; filling the channel, subsequently spraying on a bond coat, and subsequently leaching the fill; covering the channel with a foil or wire, and subsequently welding or brazing the foil or wire to the surface; or any other conventional approaches for covering a microchannel. In particular embodiments, the microchannel 6 can be covered using a marker member 14, as described further herein.

The TBC 12 can be formed over the microchannel 6 via conventional techniques, such as spraying, depositing, etc. As its name denotes, the TBC 12 is intended to act as a thermal barrier for the body 4 against environmental conditions experienced by the component 2. The TBC 12 can cover a substantial entirety of a surface of the body 4, and in some cases, TBC 12 coats multiple sides of the body 4.

Also shown, the component 2 can include a marker member 14 which can indicate a location of the microchannel 6 in the body 4. The marker member 14 can be formed of a wire, e.g., a metal wire in some embodiments. However, in other embodiments, the marker member 14 can be formed from a weld or braze build-up, e.g., an accumulation of weld or braze material (e.g., a metal), or a foil. Additionally, the marker member 14 can be formed of a non-metallic marker such as a ceramic peg, which could be bonded on or proximate to the microchannel 6. As described herein, the marker member 14 can indicate a location of the microchannel 6 from a location external to the TBC 12, e.g., a location above the TBC 12 or a location proximate an end of the microchannel 6. In some cases, as shown in FIGS. 1 and 2, some marker member(s) 14 extend vertically (out of the page) from the microchannel 6, and can extend through the TBC 12 at an interior portion 18 (FIG. 3) of the microchannel 6, the interior portion 18 being internal to the ends 16 of that microchannel 6 or proximate (touching or nearly touching) the ends 16 of that microchannel 6. This interior portion 18 can include any area of the microchannel 6 which extends under the TBC 12. In other embodiments, the marker member 14 can extend beyond the microchannel 6 in a substantially parallel manner, e.g., out of an end 16 of the microchannel 6.

Figure 3:
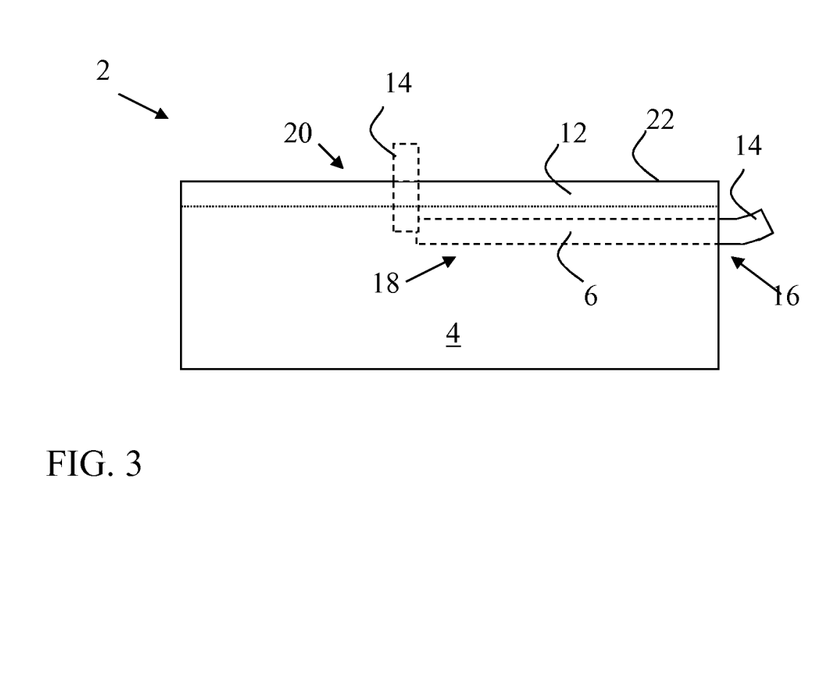
FIG. 3 shows a side view of a component according to various embodiments of the invention.

That is, in various embodiments of the invention, the marker member 14 can extend through the TBC 12 to a location 20 above an outer surface 22 of the TBC 12. The marker member 14 is thus accessible from the location 20 after the TBC 12 is formed over the body 4. As noted herein, the marker member 14 can be formed of a metal such as a metal wire, or a weld or braze build-up. As is known in the art, the TBC 12 is formed of an electrically insulating material (a non-conductor). Where the marker member 14 extends beyond the TBC 12, an electrically-based manufacturing technique such as electrical discharge machining (EDM) can be used to machine (e.g., remove) the marker member 14 to access the microchannel 6.

It is understood that regardless of the material used to form marker member 14, the marker member 14 can be machined, e.g., drilled through, to provide access to a portion of the microchannel 6. As described herein, machining the marker member 14 to access the microchannel 6 can be performed to provide an exit path for coolant within the microchannel 6.

Figure 4:
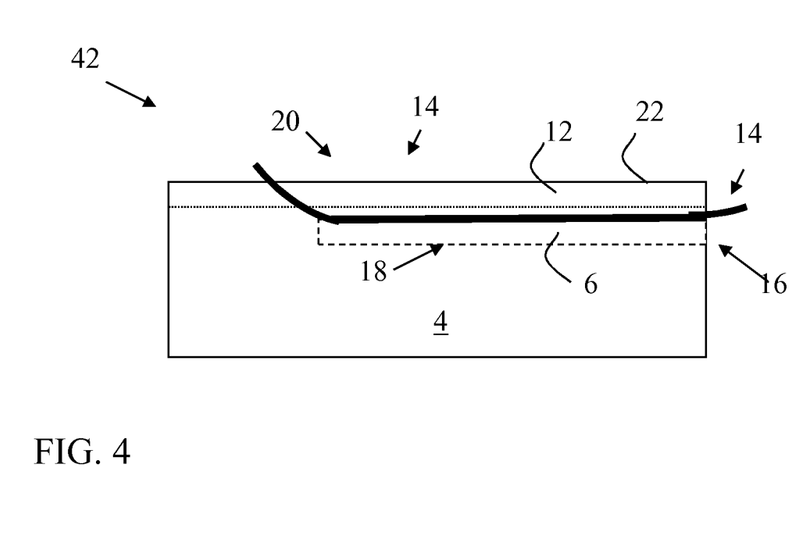
FIG. 4 shows a side view of a component according to various alternative embodiments of the invention.

Turning to FIG. 4, an alternative embodiment of a component 42 is shown according to various embodiments of the invention. In this embodiment, the component 42 can include a marker member 14 formed over the microchannel 6, which can extend at least partially upward through the TBC 12 beyond the upper surface 22 of the TBC (to the location 20 above the upper surface 22), and/or from an end 16 of the microchannel 6.

Figure 5:
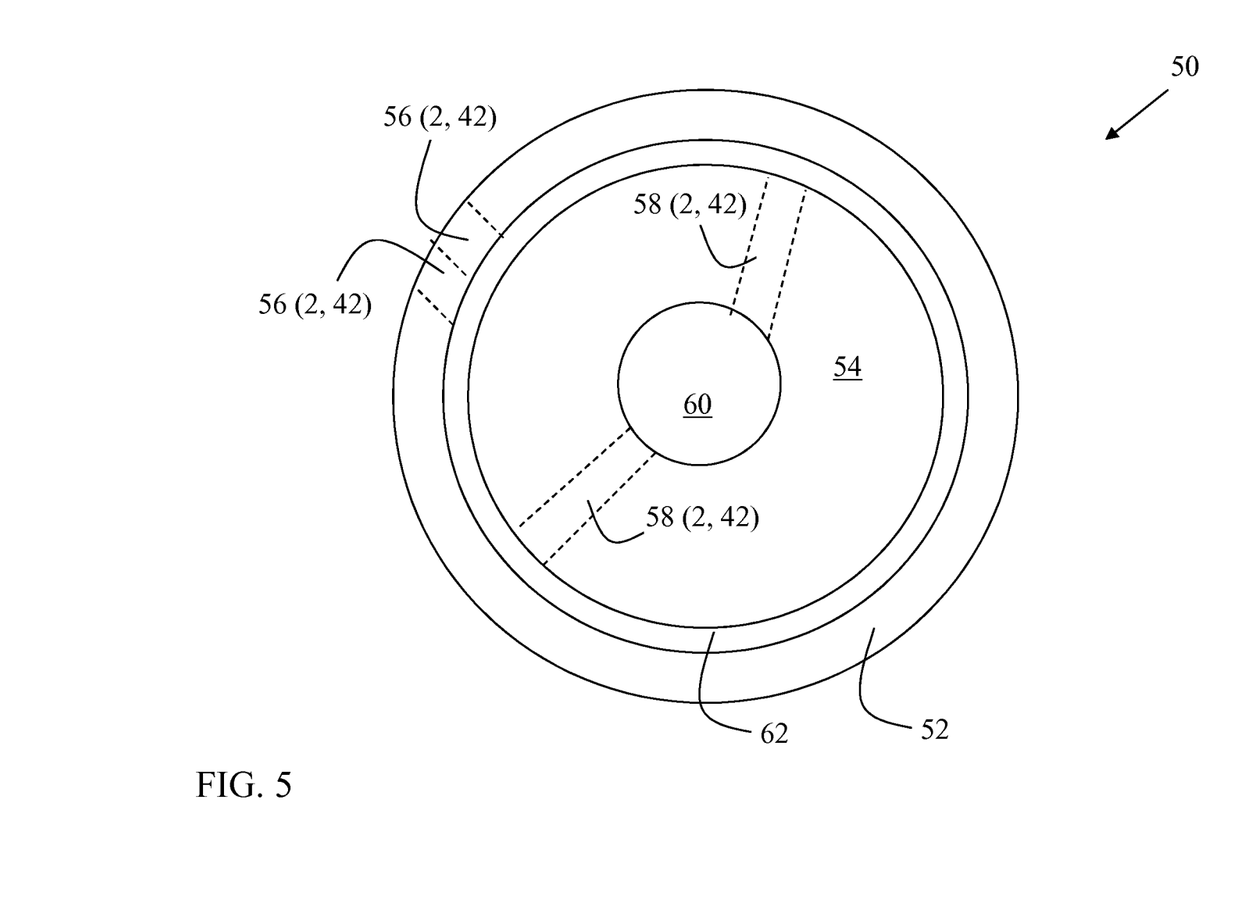
FIG. 5 shows a schematic view of a turbomachine including a component according to various embodiments of the invention.

Turning to FIG. 5, a schematic depiction of a portion of a turbomachine 50 is shown according to various embodiments of the invention. As shown, this partial depiction of selected components of the turbomachine 50 can include a stator 52 substantially surrounding a rotor 54. The stator 52 can include vanes 56 for directing the flow of a working fluid (e.g., steam) across the surfaces of buckets 58 extending from the rotor's 54 body 60. As shown, the vanes 56 and/or buckets 58 can include several of the components (e.g., component(s) 2, 42) described herein. That is, the components 2, 42 described herein can include vanes 56, buckets 58, portions of a shroud 62, or other components in a turbomachine 50.

Figure 6:
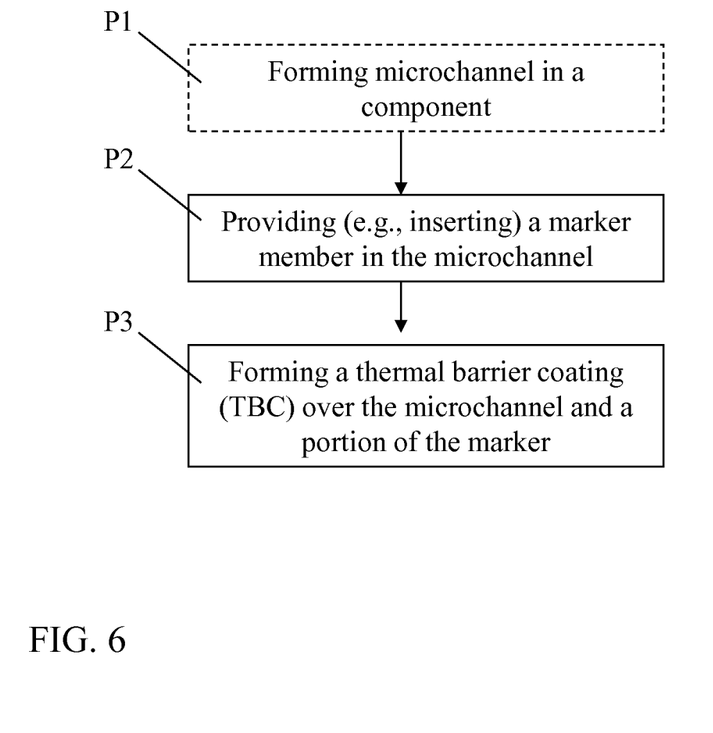
FIG. 6 shows a flow chart illustrating processes according to various embodiments of the invention.

Various methods are also disclosed according to embodiments of the invention. Turning to FIG. 6, a flow diagram is shown illustrating processes according to various embodiments of the invention.

In a first process P1, which may be a preliminary (optional) process according to embodiments, a microchannel is formed in a component. In this case, a component such as a turbine component is machined to form one or more microchannels (e.g., microchannels 6). In some cases, the microchannel(s) 6 are formed by water jet machining, electrical discharge machining, milling, laser cutting or other suitable means. The microchannel 6 can be formed with a trough 8 and a shoulder 10, where the shoulder 10 may act as a seat for a marker member 14 during subsequent processing.

Following formation of the microchannels, process P2 can include providing a marker member (e.g., marker member 14) in the microchannel 6. In some cases, where the marker member 14 includes a wire, the marker member 14 is placed in the microchannel 6 or adjacent the end 16 of the microchannel 6. In other cases, the marker member 14 is provided by forming the marker member 14 as a weld or braze build-up in the microchannel 6. In some other cases, the microchannel 6 may be covered using a foil or wire, which can then be brazed or welded over the microchannel 6. In these embodiments, the marker member 14 can be formed from this foil or wire proximate the microchannel 6 end 16 by extending the foil or wire beyond the microchannel 6 and/or by turning the foil or wire upward toward (and beyond) the outer surface 22 of the TBC 12 such that the marker member 14 extends beyond the outer surface 22 of the TBC 12 or additional coating(s) 25 (shown in phantom in FIG. 2) over the TBC 12. In some cases, as described herein, the marker member 14 can include a non-metallic material such as a ceramic peg.

Following process P2, process P3 can include forming a TBC over the microchannel 6 and a portion of the marker member 14. As noted herein, the TBC 12 can be sprayed, deposited or otherwise formed over the microchannel 6 in any conventional manner. The TBC 12 can substantially cover the microchannel 6, in particular, along a length of the microchannel 6. The TBC 12 can further cover substantial entirety of the body 4 of the component 2 to prevent thermal damage to the component 2 during use (e.g., use within a gas turbine). However, as noted herein, after formation of the TBC 12 over the body 4 (including the microchannel 6), the marker member 14 remains accessible from a location above the surface of the TBC 12.

Figure 7:
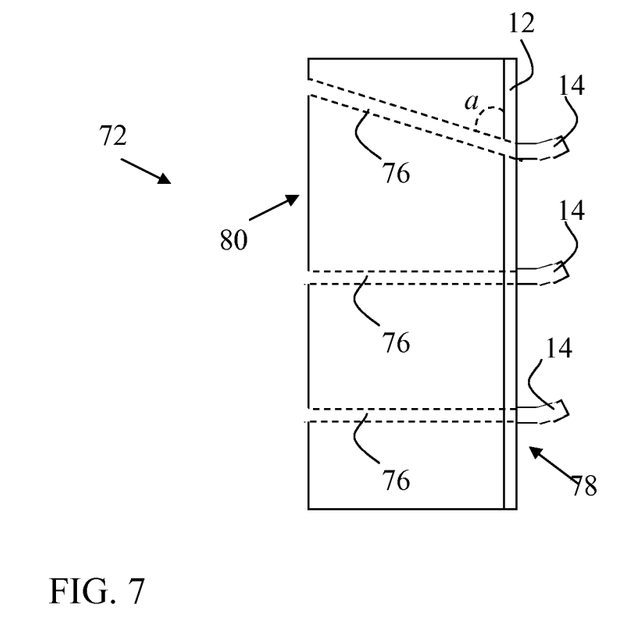
FIG. 7 shows a side view of an alternative embodiment of a component having at least one film hole and an associated marker, according to various embodiments of the invention.

FIG. 7 illustrates a side view of an alternative embodiment where a marker member 14 is used to mark the location of a film hole 76 in a component 72, e.g., an airfoil component. In some particular cases, the component 72 includes a turbine airfoil component such as a gas turbine airfoil. As is understood in the art, the film hole 76 can extend entirely through a segment of the component 72, and in some cases, the film hole 76 can extend through the segment of the component 72 at an angle (e.g., an angle a). The film hole 76 can extend from a front face 78 of the component 72 to a rear face 80 of the component 72, and can allow for the passage of a cooling fluid through the body 82 of the component 72. As shown, the component 72 can include a film hole 76 (several shown), a TBC 12 (e.g., similar to one or more other TBCs described herein) covering a portion of the film hole 76. Also shown is a marker member 14 (similar to one or more marker members shown and described herein) extending from the film hole 76 through the TBC 12. In various embodiments, the film hole 76 can have a non-uniform width, such that its opening to the front face 78 has a distinct diameter from its opening on the rear face 80. It is understood that in various embodiments, the marker member 14 could also be slightly off-set or on an edge of the opening of the film hole 76, rather than directly on the opening of the film hole 76 on either or both of the front face 78 or the rear face 80.

Figure 8:
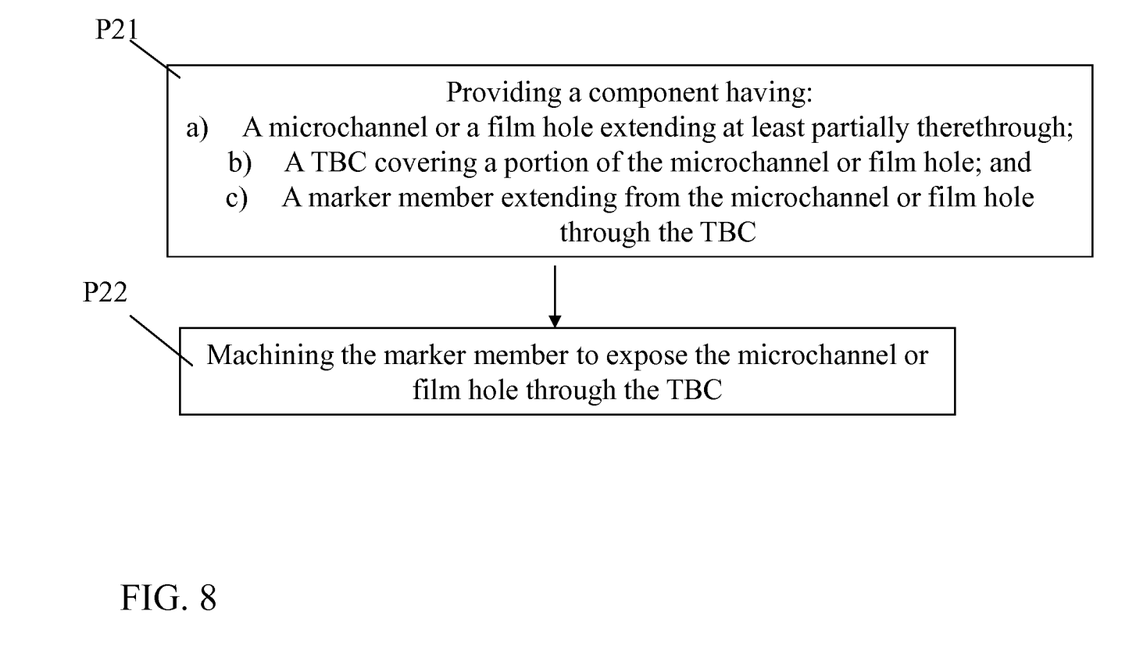
FIG. 8 shows a flow chart illustrating processes according to various embodiments of the invention.

FIG. 8 illustrates a flow diagram including processes relating to accessing the microchannel 6 after formation of the TBC 12 over the body 4, according to various embodiments of the invention. The process can include, in process P21, providing a component (e.g., component 2) having: a microchannel 6 or a film hole 76 extending at least partially therethrough; a TBC 12 covering a portion of the microchannel 6 or film hole 76; and a marker member 14 extending from the microchannel 6 or film hole 76 through the TBC 12. In some embodiments, the component can be substantially similar to the component 2 or component 72 shown and described herein, where the marker member 14 is formed including a wire or a braze or weld build-up.

Process P22 can include machining the marker member 14 to expose the microchannel 6 through the TBC 12. As noted herein, the marker member 14 can be machined from a location external to the outer surface 22 of the TBC 12 to expose the microchannel 6. In some particular cases, the machining can include performing electrical discharge machining (EDM) to remove a portion of the marker member 14. In other cases, the marker could be drilled thru by any machining process. After machining the desired portion of the marker member 14 leading from the location external to the surface 22 to the microchannel 6, the microchannel 6 is accessible, e.g., to provide a fluid therethrough for cooling of the component 2.

It is understood that while the components and methods described herein reference "microchannels", the principles of the invention can be similarly applied to film apertures, also known as film holes. That is, various embodiments of the invention can include components having film holes which can be marked using one or more marker members (e.g., marker member 14) shown and described herein.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A component comprising:
   a body;
   a microchannel extending through a portion of the body;
   a thermal barrier coating (TBC) covering a portion of the microchannel and an outer surface of the body,
   wherein the microchannel has an end not covered by the TBC, and an interior portion within the body covered by the TBC;
   a first marker member extending from the interior portion of the microchannel in the body, through the TBC to a location above an outer surface of the TBC, the first marker member indicating a location of the microchannel in the body,
   wherein the interior portion of the microchannel is substantially empty; and
   a second marker member extending from the end of the microchannel, the second marker member not extending through the TBC.

2. The component of claim 1, wherein the body includes a metal.

3. The component of claim 1, wherein at least one of the first marker member or the second marker member includes a wire.

4. The component of claim 3, wherein the wire includes a metal.

5. The component of claim 1, wherein at least one of the first marker member or the second marker member includes at least one of a weld build-up or a ceramic member.

6. The component of claim 1, wherein the body includes a turbine airfoil body.

* * * * *